United States Patent

Kobayashi et al.

Patent Number: 6,127,087
Date of Patent: Oct. 3, 2000

[54] POSITIVE PHOTORESIST COMPOSITIONS AND MULTILAYER RESIST MATERIALS USING SAME

[75] Inventors: Miki Kobayashi, Chiba; Kousuke Doi, Kanagawa; Sachiko Tamura, Kanagawa; Hidekatsu Kohara, Kanagawa; Toshimasa Nakayama, Kanagawa, all of Japan

[73] Assignee: Tokyo Ohka Kogyo Co., Ltd., Kanagawa, Japan

[21] Appl. No.: 09/098,459

[22] Filed: Jun. 17, 1998

[30] Foreign Application Priority Data

Jun. 18, 1997 [JP] Japan ................................. 9-161473
Jun. 18, 1997 [JP] Japan ................................. 9-161474

[51] Int. Cl.$^7$ .................................................. G03F 7/023
[52] U.S. Cl. ........................ 430/191; 430/165; 430/192; 430/193
[58] Field of Search ........................ 430/165, 191, 430/192, 193

[56] References Cited

U.S. PATENT DOCUMENTS

| | | | |
|---|---|---|---|
| 5,639,587 | 6/1997 | Sato et al. ................. | 430/190 |
| 5,652,081 | 7/1997 | Tan et al. ................. | 430/192 |
| 5,700,620 | 12/1997 | Sakaguchi et al. ........... | 430/191 |
| 5,702,861 | 12/1997 | Niikura et al. ............. | 430/191 |
| 5,709,977 | 1/1998 | Tan et al. ................. | 430/192 |
| 5,728,504 | 3/1998 | Hosoda et al. .............. | 430/192 |
| 5,738,968 | 4/1998 | Hosoda et al. .............. | 430/191 |
| 5,750,310 | 5/1998 | Sato et al. ................. | 430/192 |
| 5,853,948 | 12/1998 | Sawamo et al. .............. | 430/166 |
| 5,856,058 | 1/1999 | Sato et al. ................. | 430/191 |

Primary Examiner—John S. Chu
Attorney, Agent, or Firm—Sughrue, Mion, Zinn, Macpeak & Seas, PLLC

[57] ABSTRACT

A positive photoresist composition comprises (A) an alkali-soluble resin, and (B) at least one quinonediazide group-containing compound in which part or all of the hydroxyl groups of a compound represented by the following formula (I) are esterified with a quinonediazidesulfonic acid:

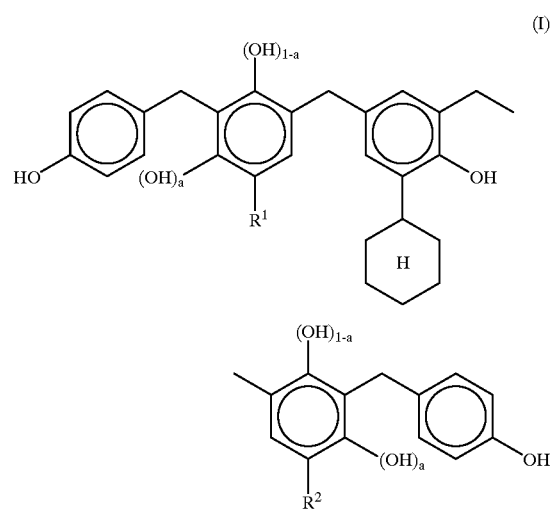

wherein each of $R^1$ and $R^2$ is an alkyl group having 1 to 5 carbon atoms, and "a" is 0 or 1. The present invention provides a positive photoresist composition which can form a resist pattern having high film residual rate, improved development contrast between exposed portions and unexposed portions, and satisfactory definition, exposure margin, focal depth range properties and sectional shape.

10 Claims, No Drawings

POSITIVE PHOTORESIST COMPOSITIONS AND MULTILAYER RESIST MATERIALS USING SAME

BACKGROUND OF THE INVENTION

1. Field of the Invention

The present invention relates to a positive photoresist composition and a multilayer resist material using same. In particular, it relates to a positive photoresist composition which provides, in the formation of isolated patterns rather than dense patterns of lines and spaces (L&S), a resist pattern having a high film residual rate, excellent development contrast, satisfactory definition (image resolution), exposure margin, focal depth range properties and sectional shape. In addition, it relates to a multilayer resist material using the positive photoresist composition.

2. Description of the Related Art

Hitherto, photoresist compositions comprising an alkali-soluble resin and a quinonediazide group-containing compound have been extensively put to a practical use in the production of semiconductor devices and liquid-crystal devices, since they are excellent in definition, sensitivity and etching resistance.

In the current manufacture of ultralarge-scale integrated circuits (Ultra LSI), a high definition of less than half a micron, for example, of 0.4 μm, 0.35 μm or the like is required. In addition, there are demands for photoresist compositions which can form a resist pattern being excellent definition, exposure margin and focal depth range properties with a good rectangular sectional shape.

It is, however, difficult to form a rectangular resist pattern having an excellent sectional shape in the formation of fine patterns of 0.4 μm or less. As a pattern becomes finer, the rate of change of the pattern shape increases due to shift of focus (i.e., deterioration in focal depth range properties). Particularly, the overall pattern tends to be narrower to the minus side (where the focus shifts or deviates from the surface of a resist film upward). This phenomenon may, at the worst, invite the twisting of the pattern formation. This phenomenon occurs more markedly in the formation of an isolated pattern than that of a dense pattern. As described above, conventional photoresist compositions are problematic in that the margin of focus shift (defocus) in which an excellent pattern profile can be produced is narrow, and as a result, slight shifts of focus in a practical exposure operation leads to scattering of the pattern profiles.

As a means of preventing deformation of a pattern shape due to light reflection from a substrate having high reflectivity such as a silicon substrate, an aluminium film, a tungsten silicide film, a measure in which an anti-reflection coating is formed between a substrate and a photoresist film (bottom anti-reflection coating (BARC) method) has been proposed. However, with such a method, the photoresist coating formed on an anti-reflection coating is disadvantageous in that the overall pattern tends to become even narrower due to a shift in focus to the minus side.

Furthermore, a phenomenon in which an isolated pattern becomes narrow overall at the minus side of the focus is thought to be attributable to the fact that such an isolated pattern is more easily subject to light reflection from the substrate than a dense pattern shape is.

Accordingly, a positive photoresist composition which has improved pattern shape in defocus to the minus side and excellent focal depth range properties is desired.

Additionally, a shift of focus to the plus side is also undesirable. Such a shift or defocus to the plus side disadvantageously invites film reduction. As a measure of improving the focal depth range properties at the plus side, the present inventors found that addition of a sulfonyl halide having a specific structure to a photoresist composition effectively inhibits tailing in the bottom and in the pattern top, and reported this in Japanese Patent Application No. 8-305873. According to this technique, focal depth range properties at the plus side can be remarkably improved not only on a substrate without an anti-reflection coating but also on an anti-reflection coating, which results in production of a photoresist coating which exhibits a small rate of change in the pattern shape, that is, has excellent focal depth range properties.

This technique, however, leads to a phenomena in which the pattern top becomes larger and the bottom becomes narrower when a defocus occurs to the minus side. In other words, the pattern has a sectional shape like a reverse-pyramid or reverse-trapezoid, which tends to lead to twisting of the pattern formation. This tendency increases in the formation of an isolated pattern as compared with that of a dense pattern, and increases with a fine pattern or a defocus shifting to the minus side.

It is also thought that since the distance between a light source and a substrate at the plus side of a focal point is shorter than a predetermined one, overexposure occurs, and hence the pattern shows a film reduction tendency at this side.

Accordingly, it is an object of the present invention to provide a positive photoresist composition which exhibits a high film residual rate, an excellent development contrast between exposed portions and unexposed portions, satisfactory definition, exposure margin and sectional profile or shape, and which provides a resist pattern having a satisfactory shape, particularly when the focus shifts to the minus side, and shows superior focal depth range properties, and a multilayer resist material using the aforementioned positive photoresist composition.

It is another object of the present invention to provide a positive photoresist composition with such excellent focal depth range properties that a resist pattern having an excellent shape can be formed even in the defocus at the minus side and the plus side.

SUMMARY OF THE INVENTION

The present inventors earnestly conducted several studies, and were able to solve the conventional problems mentioned above.

To be more specific, the present invention provides a positive photoresist composition which comprises (A) an alkali-soluble resin and (B) at least one quinonediazide group-containing compound in which part or all the hydroxyl groups of a compound shown by the following formula (I) are esterified with a quinonediazidesulfonic acid:

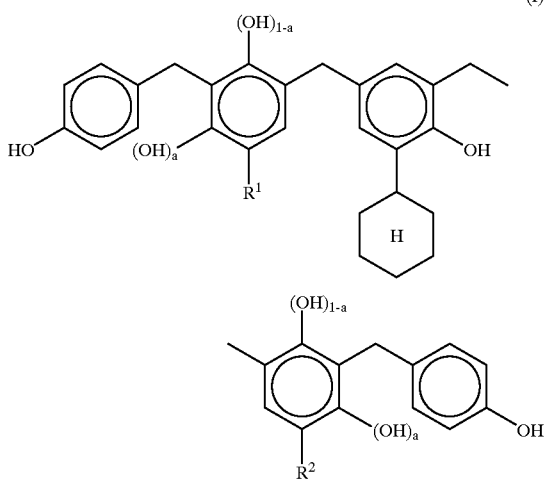

(I)

wherein each of $R^1$ and $R^2$ may be independently an alkyl group having from 1 to 5 carbon atoms and "a" denotes 0 or 1.

The present invention further provides a positive photoresist composition which comprises (A) an alkali-soluble resin, (B) a quinonediazide group-containing compound, and (C) as an sensitizer, at least one compound represented by the aforementioned formula (I).

The invention still further provides the above-mentioned positive photoresist composition, wherein the quinonediazide group-containing compound (B) is at least one quinonediazide group-containing compound in which part or the whole of the hydroxyl groups of the compound of the formula (I) are esterified with a naphthoquinonediazidesulfonic acid.

In addition, the present invention advantageously provides a positive photoresist composition which comprises (F) an alkali-soluble resin, (G) at least one quinonediazide group-containing compound in which part or all of the hydroxyl groups of a compound shown by the following formula (V) are esterified with a quinonediazidesulfonic acid:

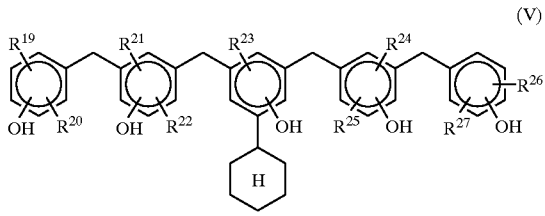

(V)

wherein each of $R^9$ to $R^{27}$ may be independently a hydrogen atom, a substituted or unsubstituted alkyl group, alkenyl group or alkoxy group each having from 1 to 5 carbon atoms, and (H) at least one sulfonyl halide represented by the following formula (III):

$$R^{16}-SO_2-X \qquad (III)$$

wherein $R^{16}$ is an alkyl group, a substituted alkyl group, an alkenyl group, an aryl group or a substituted aryl group, and X denotes F or Cl.

The invention provides the above mentioned positive photoresist composition just mentioned above, which further comprises (J) a compound shown by the following formula (IV):

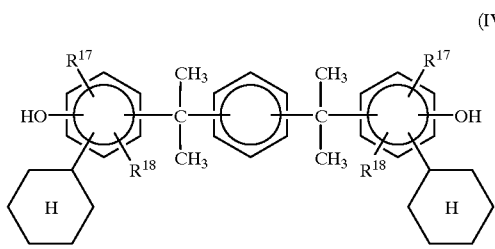

(IV)

wherein each of $R^{17}$ and $R^{18}$ is respectively a hydrogen atom, a hydroxyl group, a halogen atom, a substituted or unsubstituted alkyl group, alkenyl group or alkoxy group each having from 1 to 5 carbon atoms.

The present invention further provides the aforementioned positive photoresist composition, which further comprises (K) as an sensitizer, a hydroxyaryl represented by the following formula (II):

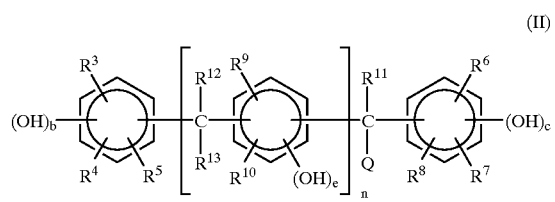

(II)

wherein each of $R^3$ to $R^{10}$ may be independently a hydrogen atom, a halogen atom, an alkyl group having from 1 to 6 carbon atoms, an alkoxy group having from 1 to 6 carbon atoms, or a cycloalkyl group; each of $R^{11}$ to $R^{13}$ is respectively a hydrogen atom or an alkyl group having from 1 to 6 carbon atoms; Q is a hydrogen atom, an alkyl group having from 1 to 6 carbon atoms, a cyclic ring having from 3 to 6 carbon atoms when bonded together with $R^{11}$, or a residue shown by the following formula:

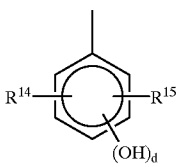

wherein each of $R^4$ and $R^{15}$ may be independently a hydrogen atom, a halogen atom, an alkyl group having from 1 to 6 carbon atoms, an alkoxy group having from 1 to 6 carbon atoms or a cycloalkyl group; "d" is an integer from 1 to 3; "b" and "c" are integers ranging from 1 to 3; "e" is an integer ranging from 0 to 3; and n is an integer ranging from 0 to 2.

The invention still further provides the positive photoresist composition wherein the content of Ingredient (H) ranges from 0.01 to 5% by weight based on the weight of the entire solid content in the composition.

In addition, the present invention provides the positive photoresist composition, wherein the content of Ingredient (J) ranges from 0.01 to 10% by weight based on the total weight of the solid content in the composition.

The present invention further provides the positive photoresist composition, wherein the compounding ratio of the quinonediazide group-containing compound (G) ranges from 10 to 60% by weight relative to the total weight of the alkali-soluble resin (F) and the sensitizer (K) which is added as necessary.

The invention still further provides a multilayer resist material composed of a substrate, an anti-reflection coating formed on the substrate, and a positive photoresist layer formed on the anti-reflection coating, wherein the positive photoresist layer is formed of the above-mentioned positive photoresist composition.

Meanwhile, Japanese Patent Laid-Open No. 8-129255 describes a photosensitive ingredient similar to Ingredient (B) used in the present invention, but a photoresist composition using the photosensitive ingredient described in this publication has insufficient focal depth range properties when the focus shifts to the minus side or to the plus side, and in particular, has little improvement of focal depth range properties when the BARC method is employed.

DESCRIPTION OF THE PREFERRED EMBODIMENT

Each of the ingredients of the composition according to the present invention will be described below. Incidentally, the composition which can cope with a focus shift to the minus side (hereinafter referred to as Composition M) and the composition which can cope with not only a minus-side defocus but also a plus-side defocus (hereinafter referred to as Composition MP) have somewhat different ingredients. Therefore, the ingredients of each of these compositions will be described further.

Composition M

First, Composition M will be described.

Composition M is composed of, as essential ingredients, the alkali-soluble resin (A) and at least one quinonediazide group-containing compound (B) in which part or all of the hydroxyl groups of the compound shown by the formula (I), or composed of, as essential ingredients, the alkali-soluble resin (A), a quinonediazide group-containing compound (B) and, as an sensitizer, at least one compound represented by the formula (I).

(A) Alkali-soluble Resin

The alkali-soluble resin used as Ingredient (A) is not limited and can be chosen from those generally used as film-forming substances in positive photoresist compositions. Of these resins, condensates of aromatic hydroxy compounds and aldehydes or ketones, polyhydroxystyrenes and their derivatives are suitable.

The aromatic hydroxyl compounds include, for example, phenol, m-cresol, p-cresol, o-cresol, 2,3-xylenol, 2,5-xylenol, 3,5-xylenol, 3,4-xylenol and other xylenols; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol and other alkyl-substituted phenols; p-methoxyphenol, m-methoxyphenol, p-ethoxyphenol, m-ethoxyphenol, p-propoxyphenol, m-propoxyphenol and other alkoxy-substituted phenols; o-isopropenylphenol, p-isopropenylphenol, 2-methyl-4-isopropenylphenol, 2-ethyl-4-isopropenylphenol and other isopropenyl-substituted phenols; phenylphenol and other aryl-substituted phenols; 4,4'-dihydroxybiphenyl, bisphenol A, resorcinol, hydroquinone, pyrogallol and other polyhydroxyphenols. These resins can be used singly or in combination.

As suitable examples of the aldehydes, formaldehyde, paraformaldehyde, trioxane, acetaldehyde, propionaldehyde, butylaldehyde, trimethylacetaldehyde, acrolein (acrylaldehyde), crotonaldehyde, cyclohexanecarbaldehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, cinnamaldehyde and the like may be mentioned. Each of these compounds may be used independently or in combination.

Examples of the ketones include acetone, methyl ethyl ketone, diethyl ketone and diphenyl ketone. Each of these ketones may be used singly or in combination. Further, an optional combination of any of aldehydes and any of ketones can be employed.

The condensate of an aromatic hydroxy compound and an aldehyde or a ketone can be prepared in the presence of an acidic catalyst according to a known technique. Such an acidic catalyst includes, for instance, hydrochloric acid, sulfuric acid, formic acid, oxalic acid, p-toluenesulfonic acid and the like.

As the polyhydroxystyrenes and their derivatives, for example, vinylphenol homopolymers, copolymers of vinylphenol and a copolymerizable comonomer. Such a comonomer includes acrylic acid derivatives, acrylonitrile, methacrylic acid derivatives, methacrylonitrile, styrene, α-methylstyrene, p-methylstyrene, o-methylstyrene, p-methoxystyrene, p-chlorostyrene and other styrene derivatives may be mentioned.

Of these alkali-soluble resins used in the present invention as Ingredient (A), novolak resins obtained from a phenol compound such as m-cresol, p-cresol, 2,5-xylenol, 3,5-xylenol, 2,3,5-trimethylphenol, and an aldehyde such as formaldehyde are advantageously used since they are effective in achieving high thermostability. Incidentally, low molecular weight fractions of the novolak resin are removed. The weight average molecular weight of the novolak resin should range from 2,000 to 25,000, preferably from 2,500 to 20,000 and more preferably from 3,000 to 10,000, while the resin should comprise no low molecular weight fraction. The term "weight average molecular weight" as used herein is defined as the value in terms of polystyrene measured by gel permeation chromatography (GPC).

The removal of low molecular weight fractions can be conducted by fractionation or other treatments. The fractionation is carried out by, for example, a process of dissolving a resin obtained by condensation in a good solvent and adding the resultant solution into water to thereby form precipitates. The good solvent includes, for instance, methanol, ethanol and other alcohols, acetone, methyl ethyl ketone and other ketones, ethylene glycol monoethyl ether acetate, and tetrahydrofuran.

(B) Quinonediazide Group-containing Compound

Next, the quinonediazide group-containing compound used in Composition M will be described.

As described above, there are two embodiments in Composition M, and in one embodiment Ingredient (B) is specified and in the other it is not specified. The term "is specified" used herein does not mean that Ingredient (B) should be the single component, but that at least one specific Ingredient (B) is to be included in the composition and that other components in addition to the specific component may be incorporated in the composition. The term "is not specified" used herein means that Ingredient (B) is not limited to a specific compound, and any type can be employed.

In the embodiment where Ingredient (B) is specified, Ingredient (B) is specified as a quinonediazidesulfonic ester of the compound of the formula (I) and quinonediazidesulfonic acids. The compounding ratio of this ester may range from 20 to 100% by weight and preferably from 50 to 95% by weight based on the total weight of Ingredient (B).

Examples of the quinonediazidesulfonic acids include halides of naphthoquinone-1,2-diazidesulfonic acid, orthobenzoquinonediazidesulfonic acid, orthoanthraquinonediazidesulfonic acid and the like. These compounds are not limited and can be chosen from those generally used. Of these compounds, naphthoquinone-1,2-diazide-5-sulfonyl chloride, naphthoquinone-1,2-diazide-4-sulfonyl chloride, naphthoquinone-1,2-diazide-6-sulfonyl chloride and other naphthoquinone-1,2-diazidesulfonyl halides are suitable.

As examples of the compounds represented by the formula (I), 2,4-bis[2-hydroxy-3-(4-hydroxybenzyl)-5-methylbenzyl]-6-cyclohexylphenol, 2,4-bis[2-hydroxy-3-(4-hydroxybenzyl)-5-ethylbenzyl]-6-cyclohexylphenol, 2,4-bis[2-hydroxy-3-(4-hydroxybenzyl)-5-propylbenzyl]-6-cyclohexylphenol, 2,4-bis[4-hydroxy-3-(4-hydroxybenzyl)-5-methylbenzyl]-6-cyclohexylphenol, 2,4-bis[4-hydroxy-3-(4-hydroxybenzyl)-5-ethylbenzyl]-6-cyclohexylphenol, 2,4-bis[4-hydroxy-3-(4-hydroxybenzyl)-5-propylbenzyl]-6-cyclohexylphenol and the like may be mentioned.

In addition to the quinonediazidesulfonic ester of the compound of the formula (I), any of esters of the other hydroxy compounds and quinonediazidesulfonic acids may be incorporated in the composition as a photosensitive ingredient.

Examples of the other hydroxy compounds include the following compounds (i) to (iii).

(i) Polyhydroxybenzophenones:

As the compounds of this category, for instance, 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone, 2,3,3',4,4',5'-hexahydroxybenzophenone and other polyhydroxybenzophenones may be mentioned.

(ii) Hydroxyaryls represented by the following formula (II):

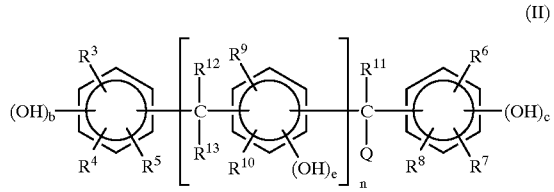

wherein each of $R^3$ to $R^{10}$ may be independently a hydrogen atom, a halogen atom, an alkyl group having from 1 to 6 carbon atoms, an alkoxy group having from 1 to 6 carbon atoms, or a cycloalkyl group; each of $R^{11}$ to $R^{13}$ is respectively a hydrogen atom or an alkyl group having from 1 to 6 carbon atoms; Q is a hydrogen atom, an alkyl group having from 1 to 6 carbon atoms, a cyclic ring having from 3 to 6 carbon atoms when bonded together with $R^{11}$, or a residue shown by the following formula:

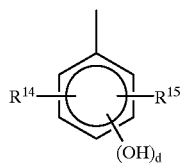

wherein each of $R^{14}$ and $R^{15}$ is a hydrogen atom, a halogen atom, an alkyl group having from 1 to 6 carbon atoms, an alkoxy group having from 1 to 6 carbon atoms or a cycloalkyl group; "d" is an integer of from 1 to 3; "b" and "c" are integers ranging from 1 to 3; "e" is an integer ranging from 0 to 3; and n is an integer ranging from 0 to 2:

Practical examples of these compounds include bis[2-hydroxy-3-(2-hydroxy-5-methylbenzyl)-5-methylphenyl]methane, tris(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(4-hydroxy-2-methyl-5-cyclohexylphenyl)-3,4-dihydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, bis(4-hydroxy-2,3,5-trimethylphenyl)-3,4-dihydroxyphenylmethane, bis(4-hydroxy-2,3,5-trimethylphenyl)-4-hydroxy-3-methoxyphenylmethane and other hydroxyaryl compounds; 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane, bis(2,4-dihydroxyphenyl)methane and other bis(hydroxyphenyl)alkane compounds; 1,1-bis(4-hydroxyphenyl)cyclohexane, 1,1-bis(2-methyl-4- hydroxyphenyl)cyclohexane and other bis(hydroxyphenyl) cycloalkane compounds and so forth.

The compounds also include 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 4,6-bis(3,5-dimethyl-4,6-dihydroxyphenylmethyl)-4-methylphenol and 2,6-bis(2,3,4-trihydroxyphenylmethyl)-4-methylphenol.

(iii) Phenols:

The compounds belonging to this category include, for instance, phenol, p-methoxyphenol, dimethylphenol, hydroquinone, bisphenol A, naphthol, pyrocatechol, pyrogallol monomethyl ether, pyrogallol-1,3-dimethyl ether, gallic acid, partially-esterified or partially-etherified gallic acid and other phenols.

The quinonediazide group-containing compound (B) used in Composition M can be obtained by, for example, subjecting any of the quinonediazidesulfonic acids and any of the compounds of the formula (I) or the above-mentioned hydroxy compounds to a condensation reaction for complete esterification or partial esterification. The condensation reaction may advantageously be conducted in an organic solvent such as dioxane, N-methylpyrrolidone or dimethylacetamide, in the presence of a basic condensing agent including triethanolamine, alkali carbonates and alkali hydrogencarbonates.

As the ester, use of an ester obtained by condensing not less than 50% by mole, preferably not less than 60% by mole of, for instance, naphthoquinone-1,2-diazide-4 (or 5)-sulfonyl halide relative to the total mole amount of the hydroxyl groups in the compound of the formula (I) or the hydroxy compound is advantageous for still higher definition.

The compounding ratio of Ingredient (B) in Composition M preferably ranges from 10 to 60% by weight, and more preferably from 20 to 50% by weight relative to the total weight of the alkali-soluble resin, Ingredient (A), and the sensitizer (C) mentioned below, which is added as necessary. The compounding ratio in this range enhances the advantages of the present invention such as high film residual rate, excellent development contrast, definition, exposure margin, focal depth range properties, sectional shape and the like. Ingredient (B) can be used singly or in combination.

(C) Sensitizer

Incorporation of the sensitizer (sense amplifier) (C) into Composition M advantageously exhibits further improving effects on pattern shape when the focus shifts to the minus side.

As Ingredient (C), at least one compound represented by the formula (I) is employed. In the embodiment where the quinonediazide group-containing compound (B) is not specified, the compounds of the formula (I) need to be used as Ingredient (C) in order to obtain desired advantages in the present invention.

In the embodiment where Ingredient (B) is specified, Ingredient (C) is not necessarily incorporated, but as necessity demands, any sensitizer conventionally used for improving sensitivity or other properties may be used. By way of illustration, at least one selected from hydroxyaryls represented by the formula (II) may be incorporated into the composition.

Examples of the hydroxyaryls represented by the formula (II) used as sensitizers include, of the compounds exemplified above, bis(4-hydroxy-2,3,5-trimethylphenyl)-2-hydroxyphenylmethane, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol and 1,1-bis(4-hydroxyphenyl)cyclohexane are preferred. Among these, bis(4-hydroxy-2,3,5-trimethylphenyl)-2-hydroxyphenylmethane, bis(4-hydroxy-3,5-dimethylphenyl)-3,4-dihydroxyphenylmethane, 2,4-bis(3,5-dimethyl-4-hydroxyphenylmethyl)-6-methylphenol and 4,6-bis[1-(4-hydroxyphenyl)isopropyl]resorcin are advantageously employed.

The compounding ratio of the sensitizer (C) may preferably range from 5 to 50% by weight and more preferably from 10 to 35% by weight relative to the weight of the alkali-soluble resin ingredient, Ingredient (A). In the embodiment where Ingredient (B) is specified, the compound of the formula (I) is incorporated in a ratio of 5 to 90% by weight of the total weight of Ingredient (C). In the embodiment where Ingredient (B) is not specified, the compound of the formula (I) may be added in a ratio ranging from 10 to 100% by weight based on the total weight of Ingredient (C).

Composition M may be incorporated with, as Ingredient (D), at least one sulfonyl halide represented by the following formula (III):

$$R^{16}-SO_2-X \qquad (III)$$

wherein $R^{16}$ is an alkyl group, a substituted alkyl group, an alkenyl group, an aryl group or a substituted aryl group, and X denotes F or Cl.

The sulfonyl halide shown by the formula (III) includes, for example, methanesulfonyl chloride, methanesulfonyl fluoride, ethanesulfonyl chloride, n-propanesulfonyl chloride, n-butanesulfonyl chloride, pentanesulfonyl chloride, dodecanesulfonyl chloride and other alkane sulfonyl halides each having from 1 to 12 carbon atoms; chloromethylsulfonyl chloride, dichloromethylsulfonyl chloride, trichloromethylsulfonyl chloride, 2-chloroethylsulfonyl chloride and other substituted alkane sulfonyl halides each having from 1 to 12 carbon atoms; ethylenesulfonyl chloride, 1-propene-1-sulfonyl chloride and other alkene sulfonyl halides each having 2 or 3 carbon atoms; benzenesulfonyl chloride, benzenesulfonyl fluoride, benzylsulfonyl chloride, 1-naphthalenesulfonyl chloride and other aryl sulfonyl halides; p-toluenesulfonyl chloride, p-ethylbenzenesulfonyl chloride, p-styrenesulfonyl chloride, p-methoxybenzenesulfonyl chloride and other alkyl-, alkenyl- or alkoxy-substituted aryl sulfonyl halides and the like. Of these halides, alkane sulfonyl halides, aryl sulfonyl halides and alkyl-substituted aryl sulfonyl halides are preferred for their well-balanced sectional shape, exposure margin and focal depth range, and among these benzylsulfonyl chloride, naphthalenesulfonyl chloride and p-toluenesulfonyl chloride are particularly preferred.

The resist solution with any of the above sulfonyl halides added may not necessarily be acidic, and rather an approximately neutral solution is preferred for its satisfactory preservation stability and stability with time. In addition, it is preferable that the sulfonyl halide does not have a very low boiling point in order to avoid sublimation during a drying step of resist coating. Thus, as a compound that is excellent in these general properties, there may be mentioned p-toluenesulfonyl chloride having a monocyclic aryl group. Incidentally, each of these sulfonyl halides may be employed independently or in combination.

The use of Ingredient (D) improves the film residual rate and achieves rectangular patterns in the formation of ultrafine patterns of the order of half a micron or below.

The content of Ingredient (D) may be adequately changed depending on the type of the substrate and undercoat, photosensitizer, and the like (for example, when a photosensitizer having a strong tapering tendency is used, Ingredient (D) can be added in an amount exceeding the following range of addition amount). In general, in both the embodiments where Ingredient (B) is specified and is not specified, Ingredient (D) is added in a ratio ranging from about 0.01 to 5% by weight, and preferably from about 0.15 to 1% by weight based on the total weight of solid content. The addition of Ingredient (D) within this range further enhances film residual rate and the effect of modifying a tapering resist pattern to a rectangular shape.

Composition M may further comprise, as Ingredient (E), a polyhydroxy compound represented by the following formula (IV)

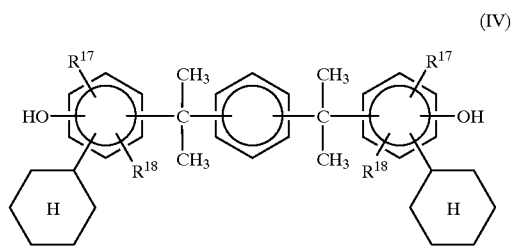

(IV)

wherein each of $R^{17}$ and $R^{18}$ may be independently a hydrogen atom, a hydroxyl group, a halogen atom, a substituted or unsubstituted alkyl group, alkenyl group or alkoxy group each having from 1 to 6 carbon atoms. The addition of Ingredient (E) improves exposure margin and film residual rate.

In the definition of $R^{17}$ and $R^{18}$ in the above formula (IV), practical examples of the alkyl group having from 1 to 6 carbon atoms include methyl group, ethyl group, propyl group, n-butyl group, isobutyl group, sec-butyl group, t-butyl group, pentyl group, hexyl group and the like. The alkenyl group having from 1 to 6 carbon atoms includes, for instance, a vinyl group and allyl group. As examples of the alkoxy group having from 1 to 6 carbon atoms, methoxy group, ethoxy group, propoxy group, isopropoxy group, n-butoxy group, isobutoxy group, sec-butoxy group, t-butoxy group, pentyloxy group, hexyloxy group and the like may be mentioned.

Typical and preferred examples of the polyhydroxy compound of the formula (IV) includes the following compounds. These compounds can be used in combination when necessary.

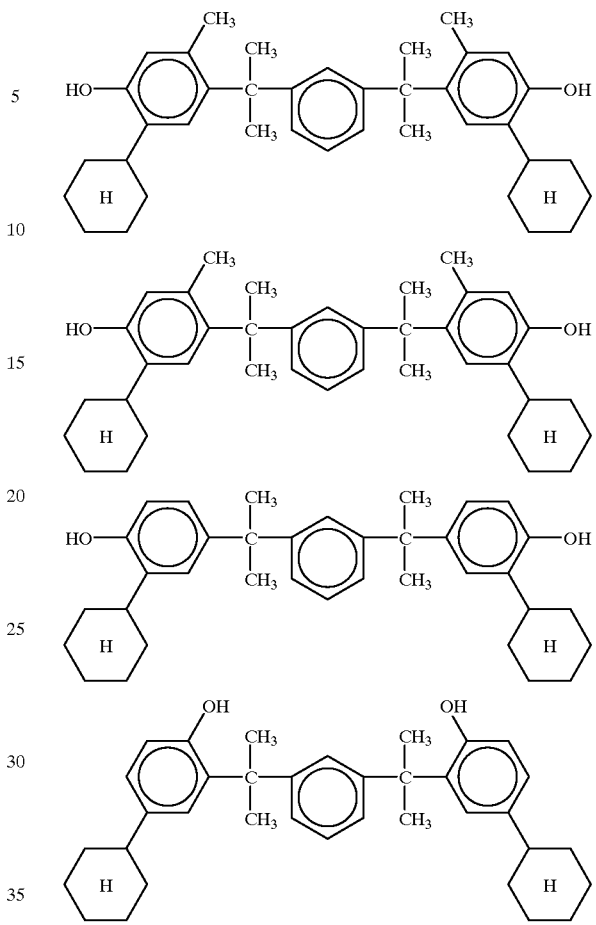

Of these compounds, 1,4-bis[1-(3-cyclohexyl-4-hydroxy-6-methylphenyl)isopropyl]benzene shown by the second formula above is preferred.

The compounding ratio of Ingredient (E) may be optionally changed depending on the type of substrate and/or undercoat, photosensitizer and the like. In general, in both the embodiments where Ingredient (B) is specified and is not specified, Ingredient (D) is added in a ratio ranging from about 0.01 to 10% by weight, and preferably from 1 to 5% by weight based on the total weight of the solid content.

When necessary, Composition M may further comprise any compatible additives including, for example, ultraviolet absorbents for inhibition of halation and surfactants for prevention of striation within a range that does not adversely affect the objects of the invention. Examples of the ultraviolet absorbents include 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene and curcumin. As the surfactants, for instance, Fluorade FC-430 and FC-431 (trade names, manufactured by Sumitomo 3MLtd., Japan), F-TOP EF122A, EF122B, EF122C and EF126 (trade names, Tochem Products Ltd., Japan) and other fluorine-containing surfactants may be mentioned.

Composition M may preferably used as a solution obtained by dissolving Ingredients (A) and (B), and each of the ingredients added according to necessity, in a proper solvent.

Examples of the solvent include acetone, methyl ethyl ketone, cyclohexanone, methyl isoamyl ketone, 2-heptanone and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers and other polyhydric alcohols and their derivatives; dioxane and other cyclic ethers; and ethyl lactate, methyl acetate, ethyl acetate, butyl acetate, methyl pyruvate, ethyl pyruvate, methyl methoxypropionate, ethyl ethoxypropionate and other esters. Each of these compounds may be used solely or in combination.

Composition M may preferably be used, for example, in the following manner: First, Ingredients (A) and (B), and other ingredients added according to necessity are each dissolved in a proper solvent as mentioned above to give a coating solution; the coating solution is then applied, using a spinner, onto a substrate such as a silicon wafer or a substrate on which an anti-reflection coating has been formed, and subsequently dried to form a photosensitive film; next, the photosensitive film is irradiated and exposed with an ultraviolet ray source such as a low-pressure mercury lamp, a high-pressure mercury lamp, an ultra-high-pressure mercury lamp, an arc lamp, or a xenon lamp, through a desired mask pattern, or irradiated with a scanning electron beam; and the exposed portions of the film are then dissolved and removed by dipping in a developer solution, for example, an alkaline aqueous solution such as a 1 to 10% by weight tetramethylammonium hydroxide (TMAH) aqueous solution, thus forming an image in exact accordance with the mask pattern.

Since Composition M prevents patterns from narrowing and gives satisfactory formation of resist patterns even when there is a minus-side defocus, it can be applied to a multi-layer resist material where a means of forming an anti-reflection coating between a substrate and a photoresist coating (BARC method) is employed.

Composition MP

Next, Composition MP will be described below.

Composition MP is composed of, as essential ingredients, (F) an alkali-soluble resin, (G) at least one quinonediazide group-containing compound in which part or all of the hydroxyl groups of the compound represented by the above-mentioned formula (V) are esterified with a quinonediazidesulfonic acid, and (H) at least one sulfonyl halide shown by the aforementioned formula (III).

As the alkali-soluble resin used as Ingredient (F)a use can be made of any of those mentioned above as Ingredient (A) in the description of Composition M.

The quinonediazide group-containing compound used as Ingredient (G) is a photosensitive ingredient, and an ester of a quinonediazidesulfonic acid and the compound of formula (V).

As the quinonediazidesulfonic acid used herein, any of those mentioned in the explanation of Composition M can be employed.

Examples of the compound shown by the formula (V) include 2,4-bis[2-hydroxy-3-(4-hydroxybenzyl)-5-methylbenzyl]-6-cyclohexylphenol, 2,4-bis[2-hydroxy-3-(4-hydroxybenzyl)-5-ethylbenzyl]-6-cyclohexylphenol, 2,4-bis[2-hydroxy-3-(4-hydroxybenzyl)-5-propylbenzyl]-6-cyclohexylphenol, 2,4-bis[2-hydroxy-3-(4-hydroxybenzyl)-5-methoxybenzyl]-6-cyclohexylphenol, 2,4-bis[2-hydroxy-3-(4-hydroxybenzyl)-5-ethoxybenzyl]-6-cyclohexylphenol, 2,4-bis[2-hydroxy-3-(4-hydroxybenzyl)-5-ethenylbenzyl]-6-cyclohexylphenol, 2,4-bis[2-hydroxy-3-(3-hydroxybenzyl)-5-methylbenzyl]-6-cyclohexylphenol, 2,4-bis[2-hydroxy-3-(5-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, 2,4-bis[4-hydroxy-3-(4-hydroxybenzyl)-5-ethylbenzyl]-6-cyclohexylphenol, 2,4-bis[4-hydroxy-3-(4-hydroxybenzyl)-5-propylbenzyl]-6-cyclohexylphenol, 2,4-bis[4-hydroxy-3-(4-hydroxybenzyl)-5-methoxybenzyl]-6-cyclohexylphenol, 2,4-bis[4-hydroxy-3-(4-hydroxybenzyl)-5-ethoxybenzyl]-6-cyclohexylphenol, 2,4-bis[4-hydroxy-3-(4-hydroxybenzyl)-5-ethenylbenzyl]-6-cyclohexylphenol, 2,4-bis[4-hydroxy-3-(4-hydroxybenzyl)-5-methylbenzyl]-3-methyl-6-cyclohexylphenol, 2,4-bis[4-hydroxy-3-(4-hydroxybenzyl)-5-ethylbenzyl]-3-methyl-6-cyclohexylphenol, 2,4-bis[4-hydroxy-3-(4-hydroxybenzyl)-5-methoxybenzyl]-3-methyl-6-cyclohexylphenol, 2,4-bis[4-hydroxy-3-(4-hydroxybenzyl)-5-ethenylbenzyl]-3-methyl-6-cyclohexylphenol, 2,4-bis[4-hydroxy-3-(4-hydroxybenzyl)-5-methylbenzyl]-3-ethyl-6-cyclohexylphenol, 2,6-bis[4-hydroxy-3-(4-hydroxybenzyl)-5-methylbenzyl]-4-cyclohexylphenol, 2,6-bis[4-hydroxy-3-(4-hydroxybenzyl)-5-ethylbenzyl]-4-cyclohexylphenol, 2,6-bis[4-hydroxy-3-(4-hydroxybenzyl)-5-methoxybenzyl]-4-cyclohexylphenol, 2,6-bis[4-hydroxy-3-(4-hydroxybenzyl)-5-ethenylbenzyl]-4-cyclohexylphenol, 2,6-bis[2-hydroxy-3-(4-hydroxybenzyl)-5-methylbenzyl]-4-cyclohexylphenol, 2,6-bis[2-hydroxy-3-(4-hydroxybenzyl)-5-ethylbenzyl]-4-cyclohexylphenol, 2,6-bis[2-hydroxy-3-(4-hydroxybenzyl)-5-methoxybenzyl]-4-cyclohexylphenol, 2,6-bis[2-hydroxy-3-(4-hydroxybenzyl)-5-ethenylbenzyl]-4-cyclohexylphenol and the like. Of these compounds, 2,4-bis[2-hydroxy-3-(4-hydroxybenzyl)-5-methylbenzyl]-6-cyclohexylphenol and 2,4-bis[4-hydroxy-3-(4-hydroxybenzyl)-5-methylbenzyl]-6-cyclohexylphenol are particularly suitable.

In addition to the quinonediazidesulfonic ester of the compound of the formula (V), any esters of other hydroxy compounds and quinonediazidesulfonic acids may be used as a photosensitive ingredient.

As the other hydroxy compounds, compounds (i) to (iii) described above in the explanation of Composition M can be employed.

The quinonediazide group-containing compound (G) can be prepared according to the process mentioned in the description of composition M.

The compounding ratio of Ingredient (G) in composition MP should preferably range from 10 to 60% by weight, and more preferably from 20 to 50% by weight, relative to the total weight of the alkali-soluble resin, Ingredient (F), and the following sensitizer (K) added when necessary. The compounding ratio in this range further enhances the advantages of the present invention including high film residual rate, excellent development contrast, definition, exposure margin, focal depth range properties, sectional shape and the like. Ingredient (G) can be employed solely or in combination. Ingredient (G) comprises, as an essential ingredient, a quinonediazidesulfonic ester of the compound represented by the formula (V), this essential ingredient may be contained in a ratio ranging from 20 to 100% by weight and preferably from 50 to 95% by weight in Ingredient (G).

(H) Sulfonyl Halide

In addition to the above-mentioned Ingredients (F) and (G), Composition MP should necessarily be composed of Ingredient (H), that is, at least one of the sulfonyl halides shown by the formula (III) as described in the explanation of Composition M.

The sulfonyl halides used in Composition MP can be chosen from those exemplified in the explanation of Composition M. Preferred examples of the sulfonyl halides are the same as those of Composition M.

The addition of Ingredient (H) mentioned above improves film residual rate and exhibits effects of modifying an originally tapering resist pattern to that of a rectangular one. The content (addition amount) of Ingredient (H) may depend on the type of the substrate and/or undercoat, and photosensitizer, and, for example, when a photosensitizer having a strong tapering tendency is used, this ingredient can be added in an amount exceeding the following range of addition amount. In other words, the content can be chosen from an appropriate range according to each case. In general, Ingredient (H) may be added in an amount ranging from 0.01 to 5% by weight, and preferably from 0.1 to 1% by weight based on the total weight of the total solid content. The addition of the Ingredient (H) within the above-specified range results in a more effective inhibition of film reduction due to defocus to the plus side, and is more effective in decreasing occurrence of a twist of pattern formation of an isolated pattern due to defocus to the minus side.

Composition MP may further comprise Ingredient (J), namely, the polyhydroxy compound shown by the formula (IV) as described in the explanation of Composition M. The addition of Ingredient (J) improves exposure margin and film residual rate.

As Ingredient (J) used in Composition MP, the polyhydroxy compounds of the formula (IV) exemplified in the description of Composition M may be mentioned. Typically, the preferred compounds are also the same as those in Composition M.

While depending on the type of substrate and/or undercoat, photosensitizer and other factors, the compounding ratio of Ingredient (J) ranges from 0.01 to 10% by weight, and preferably from 1 to 5% by weight. When Ingredient (J) is added within the above range, the advantages of the present invention are more satisfactorily exhibited.

(K) Sensitizer

Composition MP may optionally further comprise an sensitizer (sensitizer or sense amplifier) within a range that does not deteriorate its advantageous properties. As such an sensitizer, at least one selected from the hydroxyaryls shown by the formula (II) described in the explanation of Composition M may be employed.

Of the above-exemplified compounds, typically preferred examples of the hydroxyaryls of the formula (II) used as the sensitizer (K) in Composition MP include bis(4-hydroxy-2,3,5-trimethylphenyl)-2-hydroxyphenylmethane, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6 -dihydroxyphenylmethyl)-4-methylphenol, 2,6-bis(2,3,4-trihydroxyphenylmethyl)-4-methylphenol and 1,1-bis(4-hydroxyphenyl)cyclohexane. Of these compounds, particularly preferred are bis(4-hydroxy-2,3,5-trimethylphenyl)-2-hydroxyphenylmethane, bis(4-hydroxy-3,5-dimethylphenyl)-3,4-dihydroxyphenylmethane, 2,4-bis (3,5-dimethyl-4-hydroxyphenylmethyl)-6-methylphenol and 4,6-bis[1-(4-hydroxyphenyl)isopropyl]resorcin.

The sensitizer may be added to the composition in a ratio ranging from 5 to 50% by weight and preferably from 10 to 35% by weight relative to the alkali-soluble resin, Ingredient (F).

In the present invention, the use of the sensitizers (K) within the above-specified range further advantageously improves exposure margin, definition, focal depth range properties, and enhances sensitivity.

Composition MP may further comprise any compatible additive including, for example, ultraviolet absorbents for inhibition of halation and surfactants for prevention of striation within a range that does not adversely affecting the objects of the present invention. Practical examples of these additives are the same as those described in the explanation of Composition M.

Preferably, Composition MP may be used as a solution obtained by dissolving Ingredients (F), (G) and (H), and other ingredients added according to necessity in a proper solvent. Examples of the solvent are as exemplified in the explanation of Composition M.

Composition MP may preferably be used, for example, in the following manner: First, Ingredients (F) (G) and (H), and other ingredients added as necessary are each dissolved in a proper solvent mentioned above to give a coating solution; the coating solution is then applied, using a spinner, onto a substrate such as a silicon wafer or a substrate on which an anti-reflection coating has been formed and subsequently dried to form a photosensitive film; next, the photosensitive film is irradiated and exposed with an ultraviolet ray source such as a low-pressure mercury lamp, a high-pressure mercury lamp, an ultra-high-pressure mercury lamp, or a xenon lamp, through a desired mask pattern, or irradiated with a scanning electron beam; and the exposed portions of the film are then dissolved and removed by dipping in a developer solution, for example, an alkaline aqueous solution such as a 1 to 10% by weight tetramethylammonium hydroxide (TMAH) aqueous solution, thus forming an image in exact accordance with the mask pattern.

Since Composition MP provides the formation of a resist pattern having satisfactory shape even when defocus to the plus side or to the minus side occurs, the composition is excellent in focal depth range properties and can be usefully applied to a multi resist material using the means of forming an anti-reflection coating between a substrate and photoresist film (BARC method).

EXAMPLES

The present invention will be further illustrated in detail with reference to several inventive examples and comparative examples below which are not directed to limiting the scope of the invention.

Each of the characteristics of the positive photoresist compositions was evaluated according to the following methods.

(1) Exposure Margin:

A sample was applied onto a silicon wafer on which an anti-reflection coating had been formed using a spiner, and dried on a hot plate at 90° C. for 90 sec. to form a resist film having a thickness of 0.85 $\mu$m. The resist film was then irradiated from 0.1 sec. at intervals of 0.01 sec. using a reducing-type projection aligner NSR-2005i10D (manufactured by Nikon Corporation, Japan; NA=0.57). The film was then post-expose baked (PEB) at 110° C. for 90 sec.; subjected to development in a 2.38% by weight tetramethylammonium hydroxide aqueous solution at 23° C.

for 60 sec., washed with water for 30 sec., and dried. In this procedure, the exposure margin was defined as Eop/Eth (ms), where the exposure time period to give an exposed portion having a thickness of 0 after development was defined as Eth, and the exposure time period to obtain a line and space ratio of 1:1 was defined as Eop, each of which was measured in the unit of millisecond (ms).

(2) Sectional Shape:

(2-1) Plus Focus Side

An isolated resist pattern having a thickness of 0.85 μm and a width of 0.35 μm was subjected to an SEM (scanning electron microscopy) photographic observation of the sectional shape. The sectional shape of the pattern when the focus shifted 0.6 μm to the plus side was evaluated according to the following criteria:

A: Film reduction rate<10%

B: 10%≦Film reduction rate≦50%

C: 50%<Film reduction rate (2-2) Minus Focus Side

An isolated resist pattern having a thickness of 0.85 μm and a width of 0.35 μm was subjected to an SEM (scanning electron microscopy) photographic observation of the sectional shape. The sectional shape of the pattern when the focus shifted 0.4 μm to the minus side was evaluated according to the following criteria:

A: Almost rectangular, and no pattern diminishment observed

B: Reverse-tapering shape or pattern diminishment observed

C: Twisting of pattern formation (3) Focal Depth Range Property:

A sample was subjected to exposure and development using a reducing-type projection aligner NSR-2005i10D (manufactured by Nikon Corporation, Japan; NA=0.57) at an exposure of Eop (the exposure time period to forma 0.35 μm-line-and-space width as 1:1) as a standard exposure, and the focus was shifted up and down at this exposure. The obtained isolated pattern was subjected to an SEM photographic observation. Based upon the SEM photograph, the focal depth range was specified as the maximum value (μm) of the focal shift (defocus) to obtain a 0.35-μm rectangular resist pattern.

The anti-reflection coating was formed in the following manner.

In propylene glycol monomethyl ether acetate were dissolved MX-750 (Sanwa Chemical Co., Ltd., Japan) which is a melamine resin having an average of 3.7 methoxymethyl groups, 2,2',4,4'-tetrahydroxybenzophenone and a copolymer of glycidyl methacrylate and methyl methacrylate to give a coating composition; and the composition was then applied onto a silicon wafer, dried, and then baked at 180° C. to thereby give an anti-reflection coating.

Example 1

A positive photoresist composition was prepared as follows. Adequate amounts of m-cresol, p-cresol and 2,3,5-trimethylphenol (4:3:3, by mole) were mixed, and the resultant mixture was subjected to a condensation reaction with formalin in a conventional manner to form an alkali-soluble resin, and a low molecular weight fraction of the resin was removed to thereby give an alkali-soluble resin having a weight average molecular weight of 3,800. Another alkali-soluble resin having a weight average molecular weight of 4,000 was obtained from m-cresol and p-cresol (1:1, by mole) in a similar manner.

Next, both resins were then admixed in a weight ratio of 1:1. In 460 parts by weight of 2-heptanone were dissolved 100 parts by weight of the above-obtained resin ingredient, 27 parts by weight of bis(4-hydroxy-2,3,5-trimethylphenyl)-2-hydroxyphenylmethane (c1) as an sensitizer, and 43 parts by weight of an ester (A1) as a photosensitizer obtained from 1 mole of 2,4-bis[4-hydroxy-3-(4-hydroxybenzyl)-5-methylbenzyl]-6-cyclohexylphenol (a1) and 3 moles of naphthoquinone-1,2-diazide-5-sulfonyl chloride (hereinafter may be referred to as "NQD"). The resultant solution was then filtered with a membrane filter having a pore size of 0.2 μm to thereby give a positive photoresist composition.

Example 2

A positive photoresist composition was prepared in the same manner as Example 1, except that 2,4-bis[2-hydroxy-3-(4-hydroxybenzyl)-5-methylbenzyl]-6-cyclohexylphenol (a2) was used in lieu of the compound a1.

Example 3

A positive photoresist composition was formed in the same manner as Example 1, except that a mixture of the compounds a1 and c1 (1:1, by weight) were used instead of the compound c1.

Example 4

The procedure of Example 1 was repeated to thereby give a positive photoresist composition, except that in lieu of the compound c1, a mixture of the compound c1 and bis(4-hydroxy-3,5-dimethylphenyl)-3,4-dihydroxyphenylmethane (c2) (1:1, by weight) was employed, and 0.5 part by weight of p-toluenesulfonyl chloride (PTSC) was further added.

Example 5

A positive photoresist composition was formed in the same manner as Example 4, except that 3.0 parts by weight of 1,4-bis[1-(3-cyclohexyl-4-hydroxy-6-methylphenyl) isopropyl]benzene (BCIB) were further added.

Example 6

The procedure of Example 5 was repeated to thereby prepare a positive photoresist composition, except that the ester A1 was changed to an ester (B1) obtained from 1 mole of bis(4-hydroxy-2-methyl-5-cyclohexylphenyl)-3,4-dihydroxyphenylmethane (b1) and 3 moles of naphthoquinone-1,2-diazide-5-sulfonyl chloride, and the mixture of the compounds c1 and c2 (1:1, by weight) was changed to the compound a1.

Comparative Example 1

A positive photoresist composition was prepared in the same manner as Example 1, except that 2,6-bis[4-hydroxy-3-(4-hydroxybenzyl)-5-methylbenzyl]-4-cyclohexylphenol (b2) in lieu of the compound a1 was employed.

Comparative Example 2

A positive photoresist composition was obtained in the --same manner as Example 1, except that in lieu of the compound a1, 2,4-bis[4-hydroxy-3-(4-hydroxybenzyl)-5-methylbenzyl]-3-methyl-6-cyclohexylphenol (b3) was employed.

Comparative Example 3

In a manner similar to Example 6, a positive photoresist composition was prepared, except that the compound c1 was used instead of the compound a1.

The test results of the characteristics (1), (2) and (3) as mentioned above for each of the coating compositions prepared in Examples 1 to 6 and Comparative Examples 1 to 3 are set forth in Table 1.

naphthoquinone-1,2-diazide-5-sulfonyl chloride (NQD), and 0.5 part by weight of p-toluenesulfonyl chloride. The resultant solution was then filtered with a membrane filter

TABLE 1

|  | Ingredient B | Ingredient C | Ingredient D | Ingredient E | Exposure Margin | Sectional Shape Plus Side (Focus) | Sectional Shape Minus Side (Focus) | Focal Depth Range Property ($\mu$m) |
|---|---|---|---|---|---|---|---|---|
| Example |  |  |  |  |  |  |  |  |
| 1 | A1 | c1 | — | — | 2.2 | B | B | 0.8 |
| 2 | A2 | c1 | — | — | 2.2 | B | B | 0.8 |
| 3 | A1 | a1 + c1 | — | — | 2.3 | B | A | 0.9 |
| 4 | A1 | c1 + c2 | PTSC | — | 2.3 | A | A | 1.1 |
| 5 | A1 | c1 + c2 | PTSC | BCIB | 2.5 | A | A | 1.2 |
| 6 | B1 | a1 | PTSC | BCIB | 2.5 | A | A | 1.1 |
| C. Exam. |  |  |  |  |  |  |  |  |
| 1 | B2 | c1 | — | — | 2.2 | C | C | 0.5 |
| 2 | B3 | c1 | — | — | 2.2 | B | C | 0.6 |
| 3 | B1 | c1 | PTSC | BCIB | 2.2 | A | C | 0.6 |

A1: An ester of 2,4-bis[4-hydroxy-3-(4-hydroxybenzyl)-5-methylbenzyl]-6-cyclohexylphenol and NQD
A2: An ester of 2,4-bis[2-hydroxy-3-(4-hydroxybenzyl)-5-methylbenzyl]-6-cyclohexylphenol and NQD
B1: An ester of bis(4-hydroxy-2-methyl-5-cyclohexylphenyl)-3,4-dihydroxyphenylmethane and NQD
B2: An ester of 2,6-bis[4-hydroxy-3-(4-hydroxybenzyl)-5-methylbenzyl]-4-cyclohexylphenol and NQD
B3: An ester of 2,4-bis[4-hydroxy-3-(4-hydroxybenzyl)-5-methylbenzyl]-3-methyl-6-cyclohexylphenol and NQD
a1: 2,4-Bis[4-hydroxy-3-(4-hydroxybenzyl)-5-methylbenzyl]-6-cyclohexylphenol
c1: Bis(4-hydroxy-2,3,5-trimethylphenyl)-2-hydroxyphenylmethane
c2: Bis(4-hydroxy-3,5-dimethylphenyl)-3,4-dihydroxyphenylmethane
PTSC: p-Toluenesulfonyl chloride
BCIB: 1,4-Bis[1-(3-cyclohexyl-4-hydroxy-6-methylphenyl)isopropyl]benzene

Example 7

A positive photoresist composition was prepared as follows. Adequate amounts of m-cresol, p-cresol and 2,3,5-trimethylphenol (4:3:3, by mole) were mixed, and the resultant mixture was subjected to a condensation reaction with formalin in a conventional manner to form an alkali-soluble resin, and a low molecular weight fraction of the resin was removed to thereby give an alkali-soluble resin having a weight average molecular weight of 3,800. Another alkali-soluble resin having a weight average molecular weight of 4,000 was obtained from m-cresol and p-cresol (1:1, by mole) in a similar manner.

Next, both resins were then admixed in a weight ratio of 1:1. In 480 parts by weight of 2-heptanone were dissolved 100 parts by weight of the above-obtained resin ingredient, 27 parts by weight of bis(4-hydroxy-2,3,5-trimethylphenyl)-2-hydroxyphenylmethane as an sensitizer, and 43 parts by weight of an ester (A1) as a photosensitizer obtained from 1 mole of 2,4-bis[4-hydroxy-3-(4-hydroxybenzyl)-5-methylbenzyl]-6-cyclohexylphenol (a1) and 3 moles of having a pore size of 0.2 $\mu$m to thereby give a positive photoresist composition.

Example 8

A positive photoresist composition was prepared in the same manner as Example 7, except for using an ester (A2) obtained from 2,4-bis[2-hydroxy-3-(4-hydroxyphenyl)-5-methylbenzyl]-6-cyclohexylphenol and NQD in lieu of the ester A1.

Example 9

The procedure of Example 7 was repeated to thereby obtain a positive photoresist composition, except that an ester (B2) obtained from 2,6-bis[4-hydroxy-3-(4-hydroxybenzyl)-5-methylbenzyl]-4-cyclohexylphenol and NQD was employed instead of the ester A1.

Examples 10 to 12

Positive photoresist compositions were prepared in the same manner as Examples 7 to 9, except for further adding 3.5 parts by weight of 1,4-bis[1-(3-cyclohexyl-4-hydroxy-6-methylphenyl)isopropyl]benzene (BCIB). These examples corresponding to Examples 7 to 9 were respectively defined as Examples 10 to 12.

Comparative Example 4

A positive photoresist composition was formed in the same manner as Example 7, except that in lieu of the ester A1, an ester (B1) was employed.

Comparative Example 5

A positive photoresist composition was formed in the same manner as Example 9, except that p-toluenesulfonic acid was not used.

The physical properties (1), (2) and (3), as mentioned above, of the compositions prepared in Examples 7 to 12 and Comparative Examples 4 and 5 are shown in Table 2.

TABLE 2

| | Photosensitizer | Additive | Exposure Margin | Sectional Shape Plus Side (Focus) | Sectional Shape Minus Side (Focus) | Focal Depth Range Property (μm) |
|---|---|---|---|---|---|---|
| Example | | | | | | |
| 7 | A1 | — | 2.3 | A | A | 1.1 |
| 8 | A2 | — | 2.3 | A | A | 1.1 |
| 9 | B2 | — | 2.3 | A | B | 1.1 |
| 10 | A1 | BCIB | 2.5 | A | A | 1.2 |
| 11 | A2 | BCIB | 2.5 | A | A | 1.2 |
| 12 | B2 | BCIB | 2.5 | A | B | 1.2 |
| C. Exam. | | | | | | |
| 4 | B1 | — | 2.0 | B | C | 0.5 |
| 5 | B2 | — | 2.3 | C | C | 0.5 |

The present invention provides a positive photoresist composition which can form a resist pattern having high film residual rate, improved development contrast between exposed portions and unexposed portions, and satisfactory definition, exposure margin, focal depth range properties and sectional shape, in the formation of isolated patterns rather than dense patterns in which lines and spaces (L&S) are closed. In addition, the present invention provides a multilayer resist material having the advantages mentioned above.

What is claimed is:

1. A positive photoresist composition which comprises:

(A) an alkali-soluble resin, and (B) at least one quinonediazide group-containing compound in which part or all of the hydroxyl groups of a compound represented by the following formula (I) are esterified with a quinonediazidesulfonic acid:

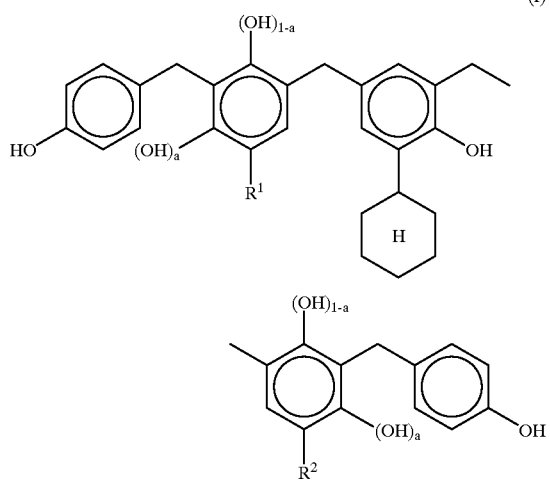

wherein each of $R^1$ and $R^2$ may be independently an alkyl group having from 1 to 5 carbon atoms, and "a" is 0 or 1.

2. A positive photoresist composition which comprises:

(A) an alkali-soluble resin, (B) a quinonediazide group-containing compound, and (C) as an sensitizer, at least one compound represented by the following formula (I):

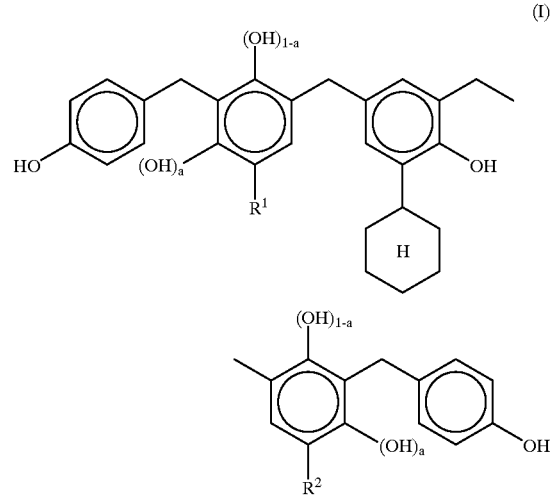

wherein each of $R^1$ and $R^2$ may be independently an alkyl group having from 1 to 5 carbon atoms, and "a" is 0 or 1.

3. The positive photoresist composition according to claim 2, wherein said quinonediazide group-containing compound (B) is at least one quinonediazide group-containing compound in which part or all of the hydroxyl groups of the compound represented by the formula (I) are esterified with a naphthoquinonediazidesulfonic acid.

4. A positive photoresist composition which comprises:

(F) an alkali-soluble resin, (G) at least one quinonediazide group-containing compound in which part or all of the hydroxyl groups of a compound represented by the following formula (V) are esterified with a quinonediazidesulfonic acid:

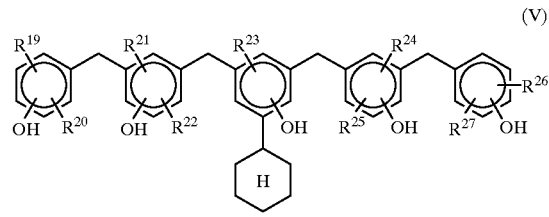

wherein each of $R^{19}$, $R^{20}$, $R^{21}$, $R^{22}$, $R^{23}$, $R^{24}$, $R^{25}$, $R^{26}$ and $R^{27}$ may be independently a hydrogen atom, a substituted or unsubstituted alkyl group, alkenyl group or alkoxy group each having from 1 to 5 carbon atoms, and (H) at least one sulfonyl halide represented by the following formula (III)

$$R^{16}-SO_2-X \quad (III)$$

wherein $R^{16}$ is an alkyl group, a substituted alkyl group, an alkenyl group, an aryl group or a substituted aryl group, and X denotes F or Cl.

5. The positive photoresist composition according to claim 4, wherein said composition further comprises a compound represented by the formula (IV):

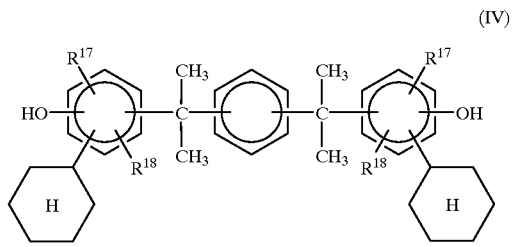

(IV)

wherein each of $R^{17}$ and $R^{18}$ is respectively a hydrogen atom, a hydroxyl group, a halogen atom, a substituted or unsubstituted alkyl group, alkenyl group or alkoxy group each having from 1 to 5 carbon atoms.

6. The positive photoresist composition according to either claim 4 or 5, wherein said composition further comprises, as an sensitizer, a hydroxyaryl represented by the following formula (II):

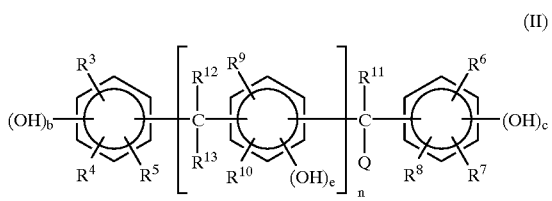

(II)

wherein each of $R^3$, $R^4$, $R^5$, $R^6$, $R^7$, $R^8$, $R^9$ and $R^{10}$ may be independently a hydrogen atom, a halogen atom, an alkyl group having from 1 to 6 carbon atoms, an alkoxy group having from 1 to 6 carbon atoms, or a cycloalkyl group; each of $R^{11}$, $R^{12}$ and $R^{13}$ is respectively a hydrogen atom or an alkyl group having from 1 to 6 carbon atoms; Q is a hydrogen atom, an alkyl group having from 1 to 6 carbon atoms, a cyclic ring having from 3 to 6 carbon atoms when bonded together with $R^{11}$, or a residue shown by the following formula:

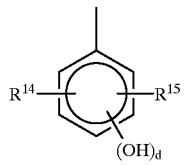

wherein each of $R^{14}$ and $R^{15}$ may be independently a hydrogen atom, a halogen atom, an alkyl group having from 1 to 6 carbon atoms, an alkoxy group having from 1 to 6 carbon atoms or a cycloalkyl group; "d" is an integer of from 1 to 3; each repetition of "b" and "c" is an integer ranging from 1 to 3; "e" is an integer ranging from 0 to 3; and n is an integer ranging from 0 to 2.

7. The positive photoresist composition according to claim 4, wherein the content of Ingredient (H) ranges from 0.01 to 5% by weight based on the total weight of solid content in the composition.

8. The positive photoresist composition according to claim 5, wherein the content of Ingredient (J) ranges from 0.01 to 10% by weight based on the total weight of solid content in the composition.

9. The positive photoresist composition according to claim 4, wherein the compounding ratio of the quinonediazide group-containing compound (G) ranges from 10 to 60% by weight relative to the total weight of the alkali-soluble resin (F) and an sensitizer (K) added a necessary.

10. A multilayer resist material comprising a substrate, an anti-reflection coating formed on said substrate, and a positive photoresist film formed on said anti-reflection coating, wherein said positive photoresist film is composed of the positive photoresist composition claimed in either claim 1 or 4.

* * * * *